(12) United States Patent
Banerjee (10) Patent No.: US 11,658,616 B2
(45) Date of Patent: May 23, 2023

(54) METHOD AND APPARATUS TO REDUCE INTER SYMBOL INTERFERENCE AND ADJACENT CHANNEL INTERFERENCE IN MIXER AND TIA FOR RF APPLICATIONS

(71) Applicant: Analog Devices International Unlimited Company, Limerick (IE)

(72) Inventor: Debopam Banerjee, Bangalore (IN)

(73) Assignee: Analog Devices International Unlimited Company, Limerick (IE)

( * ) Notice: Subject to any disclaimer, the term of this patent is extended or adjusted under 35 U.S.C. 154(b) by 44 days.

(21) Appl. No.: 17/237,887

(22) Filed: Apr. 22, 2021

(65) Prior Publication Data

US 2022/0345090 A1    Oct. 27, 2022

(51) Int. Cl.
*H04B 1/16* (2006.01)
*H03F 1/32* (2006.01)
*H03F 3/45* (2006.01)

(52) U.S. Cl.
CPC ....... *H03F 1/3211* (2013.01); *H03F 3/45475* (2013.01); *H04B 1/16* (2013.01); *H03F 2200/129* (2013.01); *H03F 2200/294* (2013.01); *H03F 2200/451* (2013.01)

(58) Field of Classification Search
CPC .. H03D 1/04; H03D 7/12; H03D 7/14; H03D 7/16; H03F 1/08; H03F 1/18; H03F 1/26; H03F 1/30; H03F 1/32; H03F 3/19; H03F 3/45; H03F 3/3211; H03F 3/45475; H03F 5/00; H04B 1/10; H04B 1/12; H04B 1/16; H04B 1/18; H04B 7/08; H04B 15/00; H04L 25/14; H04L 27/01; H04L 27/38; H04L 27/22

USPC ........ 330/51, 252, 259, 260, 277, 303, 307, 330/314; 375/316, 332, 346, 350; 455/114.1, 266, 293, 296, 307, 334
See application file for complete search history.

(56) References Cited

U.S. PATENT DOCUMENTS

| | | |
|---|---|---|
| 7,177,616 B2 | 2/2007 | Connell et al. |
| 7,376,400 B2 | 5/2008 | Bellaouar et al. |
| 7,865,164 B2 | 1/2011 | Xu et al. |
| 8,369,807 B2 | 2/2013 | Mikhemar et al. |
| 8,594,603 B2 | 11/2013 | Balankutty et al. |
| 8,655,299 B2 | 2/2014 | Mirzaei et al. |
| 9,065,390 B2 | 6/2015 | Liao et al. |
| 9,112,745 B2 | 8/2015 | Mikhemar et al. |
| 9,300,264 B2 | 3/2016 | Suravarapu et al. |

(Continued)

FOREIGN PATENT DOCUMENTS

| | | |
|---|---|---|
| CN | 102096079 B | 12/2013 |
| EP | 2688215 A1 | 1/2014 |

(Continued)

*Primary Examiner* — Shawkat M Ali
(74) *Attorney, Agent, or Firm* — Schwegman Lundberg & Woessner, P.A.

(57) ABSTRACT

A frontend circuit for a radio frequency (RF) receiver comprises an RF amplifier circuit to receive an RF signal, a local oscillator (LO) circuit to produce a LO signal, a mixer circuit configured to mix the RF signal with the LO signal to produce a down-converted intermediate frequency (IF) signal, a transimpedance amplifier (TIA) circuit to receive the IF signal, and an error reduction circuit operatively coupled to the TIA circuit and configured to reduce voltage error caused by error charge from parasitic capacitance of the frontend circuit.

17 Claims, 5 Drawing Sheets

(56) References Cited

U.S. PATENT DOCUMENTS

| | | |
|---|---|---|
| 9,344,124 B2 | 5/2016 | Lau et al. |
| 9,455,757 B2 | 9/2016 | Tripurari et al. |
| 9,496,840 B2 | 11/2016 | Lemkin et al. |
| 10,425,044 B1 | 9/2019 | Venkataraman et al. |
| 2006/0045219 A1* | 3/2006 | Wang .................. G06K 7/0008 |
| | | 375/346 |
| 2011/0124307 A1* | 5/2011 | Balankutty .............. H04B 1/12 |
| | | 455/296 |
| 2020/0028534 A1 | 1/2020 | Sivonen |

FOREIGN PATENT DOCUMENTS

| | | |
|---|---|---|
| EP | 2327152 B1 | 3/2018 |
| TW | I474629 B | 2/2015 |

\* cited by examiner

METHOD AND APPARATUS TO REDUCE INTER SYMBOL INTERFERENCE AND ADJACENT CHANNEL INTERFERENCE IN MIXER AND TIA FOR RF APPLICATIONS

FIELD OF THE DISCLOSURE

This document relates to radio frequency (RF) receivers, and in particular to integrated circuits that reduce signal noise and distortion in RF receivers.

BACKGROUND

Radio transceiver circuits receive and transmit RF signals. For an RF receiver, a signal from an antenna is amplified and processed in an RF front end of the RF receiver, The RF front end includes an amplifier stage and a mixer stage. A receiver mixer down-converts a radio frequency signal to a lower frequency. The output of the amplifier stage can have a parasitic capacitance that stores a parasitic charge. This parasitic charge can introduce distortion that degraded the signal to noise and distortion ration (SNDR) of the radio receiver.

SUMMARY OF THE DISCLOSURE

This document relates generally to radio transceiver circuits. Parasitic capacitance on the receiver front end can cause distortion in the received RF signals. In some aspects, a frontend circuit for a radio frequency (RF) receiver includes an RF amplifier circuit to receive an RE signal, a local oscillator (LO) circuit to produce a LO signal, a mixer circuit configured to mix the RF signal with the LO signal to produce a down-converted intermediate frequency (IF) signal, a transimpedance amplifier (TIA) circuit to receive the IF signal, and an error reduction circuit operatively coupled to the TIA circuit and configured to reduce voltage error caused by error charge from parasitic capacitance of the frontend circuit, In some aspects, a method of operating an RF receiver frontend includes receiving an RF signal using an RF amplifier circuit, down-converting the RF signal with a local oscillator (LO) signal to produce an intermediate frequency (IF) signal, providing the IF signal to a transimpedance amplifier (TIA), and reducing voltage error at the TIA caused by error charge from parasitic capacitance at an output of the RF amplifier circuit.

In some aspects, an electronic system includes a low noise amplifier (LNA) circuit configured to receive a radio frequency (RF) signal when operatively coupled to an RF antenna, and an RF signal circuit path. The RF signal circuit path includes a local oscillator (LO) circuit to produce a LO signal, a mixer circuit configured to mix the RF signal with the LO signal to produce a mixed RF signal, a transimpedance amplifier (TIA) circuit to receive the mixed RF signal, a pass-filter circuit operatively coupled to the TIA circuit, and an error reduction circuit operatively coupled to the TIA circuit and configured to reduce voltage error caused by parasitic charge at an output of the LNA circuit.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
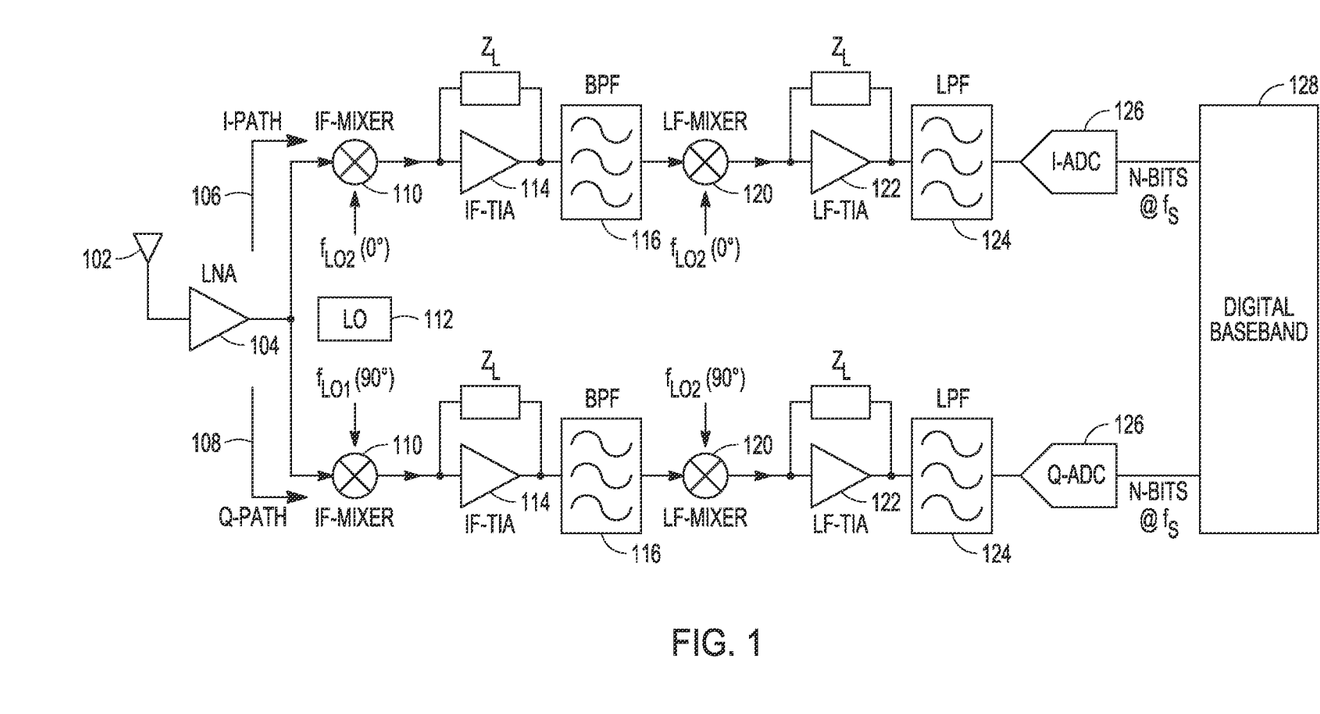
FIG. 1 is a functional block diagram of an RF receiver showing the RF front end and the subsequent digital conversion followed by baseband processing.

FIG. 1 shows an example functional block diagram of an RF receiver showing the RF front end and the subsequent digital conversion followed by baseband processing. An RF signal received by antenna 102 is amplified using low noise amplifier (LNA) 104. In the example of FIG. 1, the RF receiver front end includes two RF circuit paths: an in-phase signal circuit path (I-path) 106 and a quadrature circuit path (Q-path) 108, Each RF circuit path in the example includes an intermediate frequency (IF) mixer circuit 110. The amplified RF signal is one input to the mixer circuit 110. The other input is a local oscillator (LO) signal produced by a LO circuit 112. The LO signal has frequency $f_{LO1}$ and the LO signal provided to the Q-path IF-mixer circuit is 90° out of phase with the LO signal provided to the I-path IF-mixer circuit.

A mixer circuit 110 takes the RF signal of frequency $f_{RF}$ and mixes it with the LO signal of frequency $f_{LO1}$ to produce an IF output signal that consists of the sum and difference frequencies, $f_{RF} \pm f_{LO}$. The IF output signal is provided to a transimpedance amplifier (TIA) 114, that passes the IF output signal to a bandpass filter (BPF) 116 that passes one of the sum frequency $f_{RF}+f_{LO}$ or the difference frequency $f_{RF}-f_{LO}$. Each of the RF circuit paths may include a low frequency (LF) mixer circuit 120 to produce an LF output signal that is provided to a low frequency TIA 122 and a low pass filter circuit 124. And analog-to-digital converter (ADC) circuit 126 samples the filtered signal and provides the samples to a digital baseband processor 128.

Figure 2:
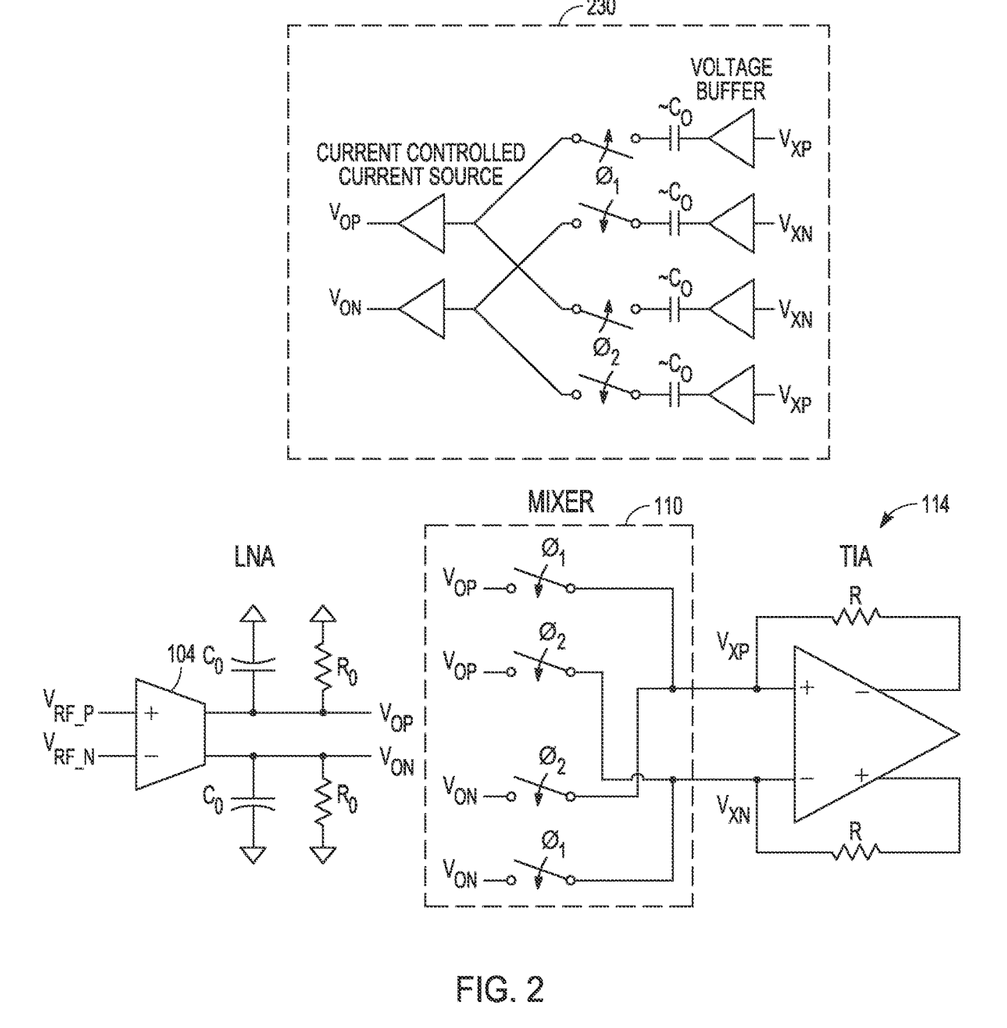
FIG. 2 is a circuit diagram of a low noise amplifier, a mixer circuit, a transimpedance amplifier, and an error reduction circuit.

FIG. 2 shows examples of an LNA 104, mixer circuit 110, and TIA 114. The LNA 104 preceding the mixer circuit 110 can be modelled as a transconductance ($g_m$) stage with a differential output having a high output impedance feeding into the mixer circuit 110. The stage before the mixer 110 can be the LNA 104 for a direct conversion receiver or an IF stage for a double conversion receiver having an IF-mixer and an LF-mixer.

The mixer circuit 110 is a switching circuit block. The mixer circuit 110 may mix the RF signal from the LNA 104 and the LO signal from the LO circuit by switching the outputs of the LNA amplifier ($v_{op}$ and $v_{on}$) at the input to the TIA 114 ($v_{xp}$ and $v_{xn}$). On phase 1 of the LO signal, outputs $v_{op}$, $v_{on}$ of the LNA 104 are applied respectively to inputs $v_{xp}$, $v_{xn}$ of the TIA 114. On phase 2 of the LO signal, outputs $v_{op}$, $v_{on}$ of the LNA 104 are switched respectively to inputs $v_{xn}$, $v_{xp}$ of the TIA 114. If the mixer circuit 110 is a downconverter, an IF output signal with a frequency of $f_{RF}-f_{LO}$ goes into the TIA 114 providing a low-impedance path for the down-converted signal current.

The output capacitance ($C_O$) of the LNA 104 preceding the mixer circuit 110 along with the parasitic capacitance between the LNA 104 output and the TIA 114 input causes a dynamic error or Intersymbol Interference (ISI) when the output nodes of the LNA 104 are switched between the differential inputs of the TIA 114.

This is because the voltage of the two input nodes of the TIA 114 will be different from each other during operation and the parasitic output capacitance will have to be charged between these voltages every time the mixer circuit 110 switches polarity with the bulk of charge drawn coming from the TIA 114 output causing an error accumulation. The voltage difference $|v_{xp}-v_{xn}|$ is typically due to the finite gain of the TIA 114 and is thus heavily signal dependent. This input dependent error charge flows to the output of the TIA 114 and causes non-linearity that degrades the signal-to noise and distortion ratio (SNDR).

The charge Q drawn to the outputs of the TIA from the $v_{xp}$ and $v_{xn}$ nodes is $$Q_N = \left(V_{OP}\left[n+\frac{1}{2}\right] - V_{ON}[n]\right) \times C_O.$$

It does not matter if the parasitic output capacitance is linear or non-linear as the charge drawn has to be supplied by the output of the TIA 114. If the ratio of the frequency of the LO signal to the frequency bandwidth of the TIA or $$\frac{fLO}{fIN\_BW}$$

is high, then the TIA 114 will not be able to settle this error charge and the error would appear as distortion tones. The problem is exacerbated if there is a high frequency tone and/or the jammer has high enough amplitude.

One approach to get around this problem is to make the $|v_{xp}-v_{xn}|$ difference itself very small by increasing the gain of the TIA, but this would require more area and a greater amount of power. This becomes even more difficult in lower geometries where there is a headroom issue at lower supplies. Another approach is to allow the error charge to settle or allow the TIA 114 to recover from the glitch, but this would also require a greater amount of power.

FIG. 2 also shows an example of an error reduction circuit 230 to improve SNDR in RF circuits. The error reduction circuit 230 includes an arrangement of switching circuits that replaces the switching circuit of the mixer circuit 110. It also includes current controlled current sources at the input of the switching circuit and a fast response voltage buffer circuit across the output of the switching circuits. The error reduction circuit 230 reduces the charge $Q_P$, $Q_N$ drawn from $v_{xp}$ and $v_{xn}$ nodes. During phase 1 of the LO signal, a buffered version of LNA input $v_{op}$ is connected through a cancellation capacitor $\sim C_o$ to node $v_{xp}$ of the TIA 114, and a buffered version of LNA input $v_{on}$ is connected through a cancellation capacitor $\sim C_o$ to node $v_{op}$ of the TIA 114. During phase 2 of the LO signal, a buffered version of LNA input $v_{op}$ is connected through a cancellation capacitor $\sim C_o$ to node $v_{xn}$ of the TIA 114, and a buffered version of LNA input $v_{on}$ is connected through a cancellation capacitor $\sim C_o$ to node $v_{op}$ of the TIA 114. The cancellation capacitors approximate the parasitic capacitances at the output of the LNA 104, the input of the TIA, and the parasitic routing caps, and store approximately the parasitic charge or error charge. Switching the differential outputs of the LNA 104 and the TIA 114 through the cancellation capacitors subtracts the error charge from the differential outputs to reduce or cancel the error charge.

Figure 3:
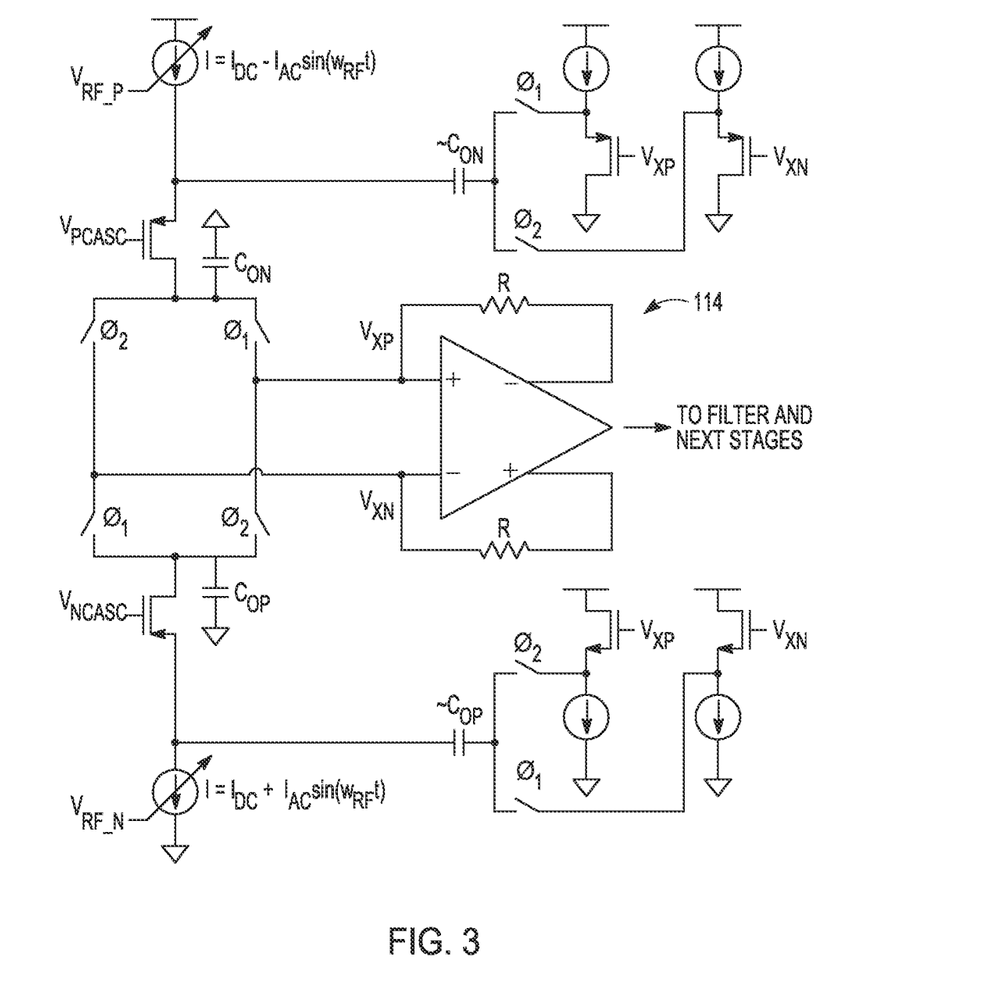
FIG. 3 is a circuit diagram of another example of an error reduction circuit.

FIG. 3 is a circuit diagram of an example of an implementation of the error reduction circuit of FIG. 2. Here the $v_{xp}$ and $v_{xn}$ nodes are buffered using the NMOS and PMOS source-followers whose outputs are connected by switches to the cancellation capacitors shown as $\sim C_{OP}$ and $\sim C_{ON}$. These cancellation capacitors are switched between the buffered versions of $v_{xp}$ and $v_{xn}$ depending on which output of the LNA is connected to $v_{xp}$ and $v_{xn}$ at that moment. The controllable tail current sources are modelling the LNA 104 or BPF 116 outputs.

The LNA 104 might be placed relatively far from the mixer circuit 110 and the TIA 114. For instance, the power amplifier may be placed closer to the antenna pad to avoid loss in output power in the routing resistances. The increased distance between the LNA 104 and the mixer circuit 110 and TIA 114 may significantly increase the parasitic capacitance at the mixer input. The capacitance of the cancellation capacitors would also increase to match the parasitic capacitance resulting in a larger capacitor used for charge cancellation. The larger capacitor size can increase the power used by the TIA 114. This drawback can be overcome by buffering an amplified version of $|v_{xp}-v_{xn}|$ and then using a capacitance for the cancellation capacitors whose value is reduced by the magnitude of that gain.

Figure 4:
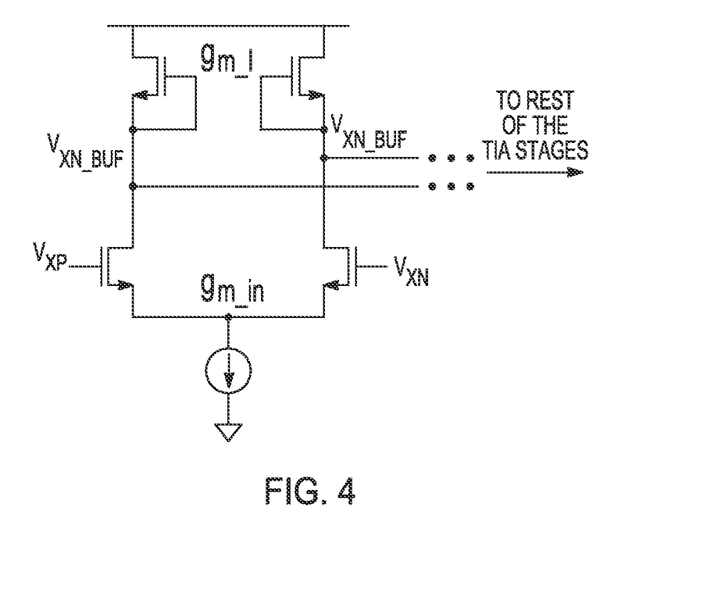
FIG. 4 is a circuit diagram of an example of an amplifier stage.

FIG. 4 is a circuit diagram of an example of an amplifier stage that buffers and amplifies $|v_{xp}-v_{xn}|$. The gain of the amplifier Av is $$A_V = \frac{g_{m\_in}}{g_{m\_l}}, \text{ and } A_V = \frac{v_{xp\_buf} - v_{xn\_buf}}{v_{xp} - v_{xn}}.$$

The cancellation capacitance can be reduced by $$C_{CANCELLATION} = \frac{C_{OP}}{A_v}.$$

Table 1 shows the results of simulation of the mixer circuit 100 and TIA circuit 114 of FIG. 2 without and with the error reduction circuit 230. Use of the error reduction circuit 230 improved the SNDR by about 11-14 decibels (dB).

TABLE 1

|  | SNDR (without Error Reduction) | SNDR (with Error Reduction) |
|---|---|---|
| Single Tone in absence of adjacent channel jammer | ~80 dB | ~94 dB |
| Single Tone in presence of adjacent channel jammer | ~45 dB | ~56 dB |

Figure 5:
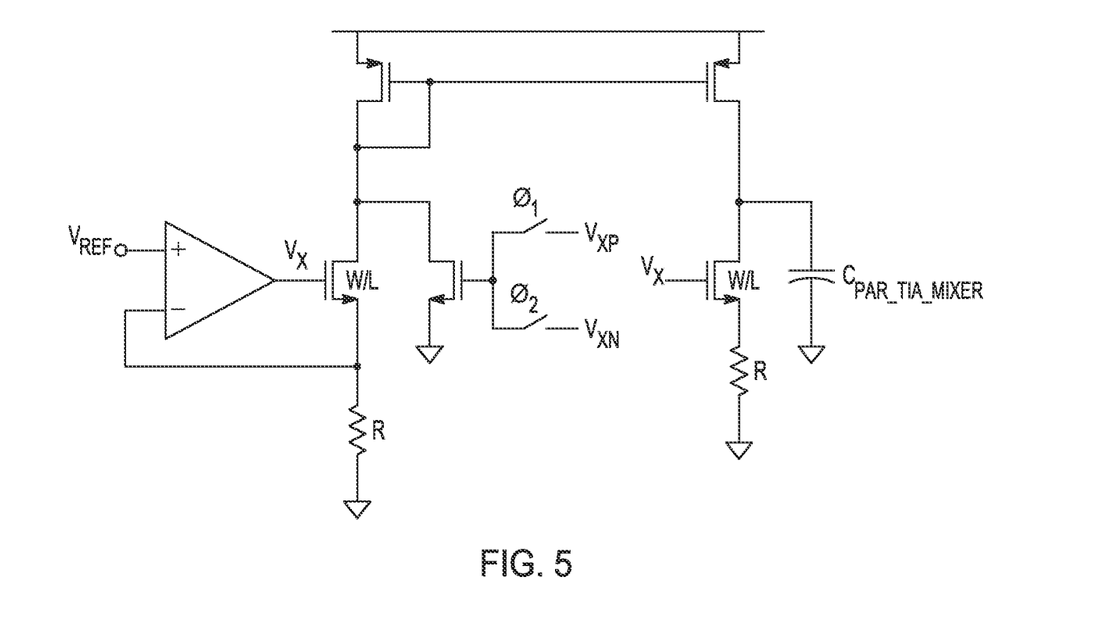
FIG. 5 is a circuit diagram of another example of an error reduction circuit.

FIG. 5 is a circuit diagram of another error reduction circuit. The circuit includes a voltage-controlled current source that is controlled using the error voltage at the TIA inputs appearing on the parasitic capacitances. The error reduction circuit can include two voltage-controlled current sources. One of the current sources can be coupled to one of the outputs of the LNA in FIG. 2 or the inputs to the TIA 114. When the voltage error increases, the current increases to remove the error charge. This provides a fast response to the error resulting from switching of the mixer circuit.

Figure 6:
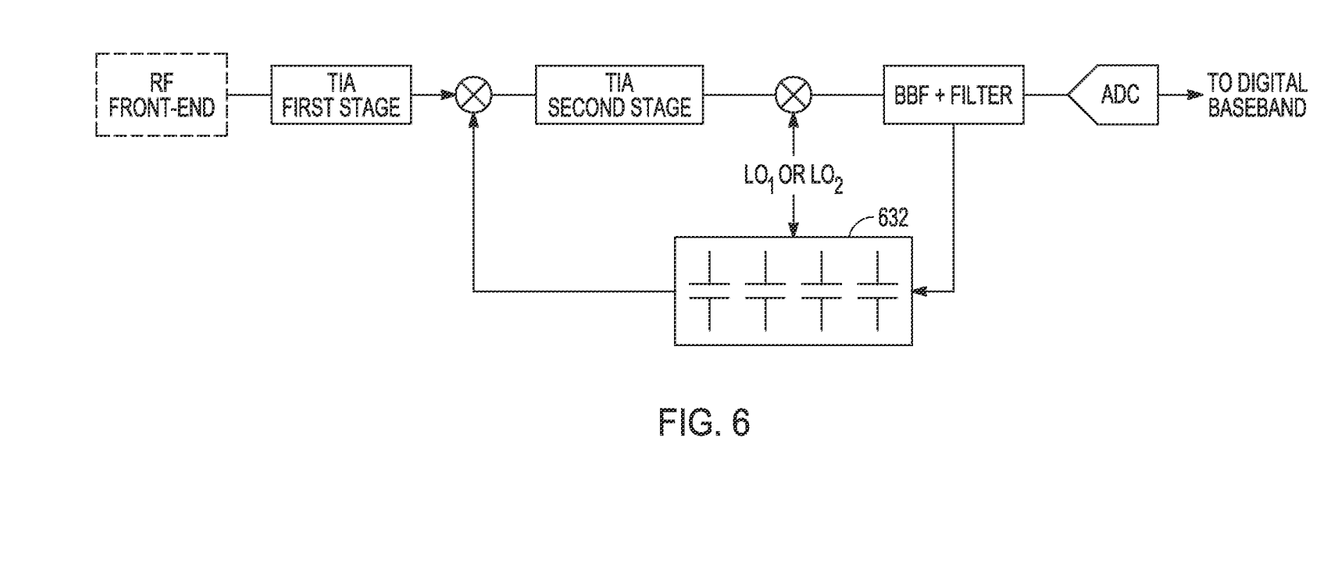
FIG. 6 is a circuit diagram of a further example of an error reduction circuit.

FIG. 6 is a circuit diagram of another error reduction circuit. The error reduction circuit includes a notch filter circuit that has a transfer function that includes at least one null point near one or more harmonics of the frequency of the LO signal. An example of a notch filter circuit is a finite impulse response (FIR) filter circuit 632 that has a capacitor bank that provides the notches or null points corresponding to harmonics of the frequency of the LO signal. This filters or reduces the voltage error resulting from the switching of the mixer circuit at the LO frequency. The FIR filter circuit may include null points at harmonics of one or both of the IF mixer circuit and the LF mixer circuit.

The devices, systems and methods described herein reduce Intersymbol Interference (ISI) and adjacent channel interference (ACI), and improve adjacent channel rejection (ACR) in RF receiver front end circuits. Parasitic charge from parasitic capacitances in the RF receiver front end is reduced to improve SNDR.

ADDITIONAL DESCRIPTION AND ASPECTS

A first Aspect (Aspect 1) includes subject matter (such as a frontend circuit for an RF receiver comprising an RF amplifier circuit to receive an RF signal, a local oscillator (LO) circuit to produce a LO signal, a mixer circuit configured to mix the RF signal with the LO signal to produce a down-converted intermediate frequency (IF) signal, a transimpedance amplifier (TIA) circuit to receive the IF signal, and an error reduction circuit operatively coupled to the TIA circuit and configured to reduce voltage error caused by error charge from parasitic capacitance of the frontend circuit.

In Aspect 2, the subject matter of Aspect 1 optionally includes an LO circuit that produces an LO signal having multiple phases, an RF amplifier circuit having a differential output including a first amplifier output and a second amplifier output, and an error reduction circuit including first and second cancellation capacitors coupled respectively to the first and second amplifier outputs, and a switching circuit configured to apply the error charge to the first and second cancellation capacitors during a first phase of the LO signal and subtract the error charge applied to the first and second cancellation capacitors from the differential output during a second phase of the LO signal.

In Aspect 3, the subject matter of Aspect 2 optionally includes a TIA circuit having a differential input, and a charge reduction circuit that includes source follower circuits coupled between the first and second cancellation capacitors and the differential input of the TIA circuit.

In Aspect 4, the subject matter of one or both of Aspects 2 and 3 optionally includes a first current controlled current source coupled to the first amplifier output and the switching circuit, and a second current controlled current source coupled to the second amplifier output and the switching circuit.

In Aspect 5, the subject matter of one or both of any combination of Aspects 1-4 optionally includes an RF amplifier circuit has a differential output including a first RF amplifier output and a second RF amplifier output, and an error reduction circuit includes a first voltage-controlled current source coupled to the first RF amplifier output and a second voltage-controlled current source coupled to the second RF amplifier output, and the voltage error increases current of one or both of the first and second voltage-controlled current sources to remove the error charge from one or both of the first and second RF outputs.

In Aspect 6, the subject matter of one or any combination of Aspects 1-5 optionally includes a mixer circuit switches polarity of the differential output of the RF amplifier circuit at a frequency of the LO signal, an RF amplifier circuit has a differential output including a first amplifier output and a second amplifier output, and an error reduction circuit that includes first and second cancellation capacitors coupled respectively to a first output and a second output of the differential output of the RF amplifier circuit, and a switching circuit configured to subtract error charge applied to the first and second cancellation capacitors from the differential output of the RF amplifier circuit when the polarity of the differential output of the RF amplifier circuit is switched.

In Aspect 7, the subject matter of one or any combination of Aspects 1-6 optionally includes an error reduction circuit that includes a finite impulse response (FIR) filter circuit having a transfer function that includes at least one null point near one or more harmonics of the frequency of the LO signal.

Aspect 8 includes subject matter (such as a method of operating an RF receiver frontend) or can optionally be combined with one or any combination of Aspects 1-7 optionally includes receiving an RF signal using an RF amplifier circuit, down-converting the RF signal with a local oscillator (LO) signal to produce an intermediate frequency (IF) signal, providing the IF signal to a transimpedance amplifier (TIA), and reducing voltage error at the TIA caused by error charge from parasitic capacitance at an output of the RF amplifier circuit.

In Aspect 9, the subject matter of Aspect 8 optionally includes applying the error charge to first and second cancellation capacitors during a first phase of the signal, and subtracting the error charge applied to the first and second cancellation capacitors from a differential output of the RF amplifier circuit during a second phase of the LO signal.

In Aspect 10, the subject matter of one or both of Aspects 8 and 9 optionally includes switching polarity of a differential output of the RF amplifier circuit at a frequency of the (IF) signal, storing the error charge on first and second cancellation capacitors, and subtracting the stored error charge from a differential output of the RF amplifier circuit when the polarity of the polarity of the differential output of the RF amplifier circuit is switched.

In Aspect 11, the subject matter of one or both of Aspects 8 and 9 optionally includes switching polarity of a differential output of the RF amplifier circuit at a frequency of the LO signal, providing current to each of a first output and a second output of the differential output of the RF amplifier circuit, and increasing the current when the polarity of the differential output of the RF amplifier circuit is switched.

In Aspect 12, the subject matter of one or any combination of Aspects 8 and 9 optionally includes switching polarity of a differential output of the RF amplifier circuit at a frequency of the LO signal, and filtering the mixed RF signal using a notch filter.

Aspect 13 includes subject matter (such as an electronic system) or can optionally be combined with one or any combination of Aspects of 1-12 to include such subject matter, comprising a low noise amplifier (LNA) circuit configured to receive a radio frequency (RF) signal when operatively coupled to an RF antenna, and an RF signal circuit path that includes a local oscillator (LO) circuit to produce a LO signal, a mixer circuit configured to mix the RF signal with the LO signal to produce a mixed RF signal, a transimpedance amplifier (TIA) circuit to receive the mixed RF signal, a pass-filter circuit operatively coupled to the TIA circuit, and an error reduction circuit operatively coupled to the TIA circuit and configured to reduce voltage error caused by parasitic charge at an output of the LNA circuit.

In Aspect 14, the subject matter of Aspect 13 optionally includes an LNA circuit having a differential output including a first amplifier output and a second amplifier output, an LO circuit that produces an LO signal having multiple phases, and an error reduction circuit that includes first and second cancellation capacitors coupled respectively to the first and second amplifier outputs, and a switching circuit configured to apply the parasitic charge to the first and second cancellation capacitors during a first phase of the LO signal and subtract the parasitic charge applied to the first and second cancellation capacitors from the differential output during a second phase of the LO signal.

In Aspect 15, the subject matter of one or both of Aspects 13 and 14 optionally includes a first mixer input and a second mixer input, and the TIA circuit has a differential input, and an error reduction circuit that includes a first voltage-controlled current source coupled to the first mixer input and a second voltage-controlled current source coupled to the second mixer, and the voltage error increases current of one or both of the first and second voltage-controlled current sources to reduce the voltage error at the differential input of the TIA circuit.

In Aspect 16, the subject matter of one or any combination of Aspects 13-15 optionally includes an error reduction circuit includes a notch filter circuit having a transfer function that includes at least one null point near one or more harmonic frequency of the LO signal.

In Aspect 17, the subject matter of one or any combination of Aspects 13-16 optionally includes an RF signal circuit path that is an in-phase signal circuit path.

In Aspect 18, the subject matter of one or any combination of Aspects 13-17 optionally includes an RF signal circuit path that is a quadrature circuit path.

In Aspect 19, the subject matter of one or any combination of Aspects 13-18 optionally includes a mixer circuit that produces an intermediate radio frequency (IF) signal, and the pass filter is a baseband pass filter.

In Aspect 20, the subject matter of one or any combination of Aspects 13-20 optionally includes a mixer circuit produces a low radio frequency (LF) signal, and the pass filter is a low pass filter.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a. claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A frontend circuit for a radio frequency (RF) receiver, the frontend circuit comprising:
    a local oscillator (LO) circuit to produce a LO signal, wherein the LO signal has multiple phases;
    an RF amplifier circuit to receive an RF signal, wherein the RF amplifier circuit has a differential output including a first amplifier output and a second amplifier output;
    a mixer circuit configured to mix the RF signal with the LO signal to produce a down-converted intermediate frequency (IF) signal;
    a transimpedance amplifier (TIA) circuit to receive the IF signal; and
    an error reduction circuit operatively coupled to the TIA circuit, wherein the error reduction circuit reduces voltage error caused by error charge from parasitic capacitance of the frontend circuit and includes:
    first and second cancellation capacitors coupled respectively to the first and second amplifier outputs; and
    a switching circuit configured to apply the error charge to the first and second cancellation capacitors during a first phase of the LO signal and subtract the error charge applied to the first and second cancellation capacitors from the differential output during a second phase of the LO signal.

2. The frontend circuit of claim 1,
    wherein the TIA circuit has a differential input; and wherein the error reduction circuit includes source follower circuits coupled between the first and second cancellation capacitors and the differential input of the TIA circuit.

3. The frontend circuit of claim 1, including:
a first current controlled current source coupled to the first amplifier output and the switching circuit; and
a second current controlled current source coupled to the second amplifier output and the switching circuit.

4. The frontend circuit of claim 1,
wherein the RF amplifier circuit has the differential output including a first RF amplifier output and a second RF amplifier output; and
wherein the error reduction circuit includes a first voltage-controlled current source coupled to the first RF amplifier output and a second voltage-controlled current source coupled to the second RF amplifier output, and the voltage error increases current of one or both of the first and second voltage-controlled current sources to remove the error charge from one or both of the first and second RF amplifier outputs.

5. The frontend circuit of claim 1,
wherein the mixer circuit switches polarity of the differential output of the RF amplifier circuit at a frequency of the LO signal;
wherein the RF amplifier circuit has the differential output including a first RF amplifier output and a second RF amplifier output; and
wherein the error reduction circuit includes:
first and second cancellation capacitors coupled respectively to a first output and a second output of the differential output of the RF amplifier circuit; and
the switching circuit configured to subtract the error charge applied to the first and second cancellation capacitors from the differential output of the RF amplifier circuit when the polarity of the differential output of the RF amplifier circuit is switched.

6. The frontend circuit of claim 1, wherein the error reduction circuit includes a finite impulse response (FIR) filter circuit having a transfer function that includes at least one null point near one or more harmonics frequencies of the LO signal.

7. A method of operating a radio frequency (RF) receiver frontend, the method comprising:
receiving an RF signal utilizing an RF amplifier circuit
down-converting the RF signal with a local oscillator (LO) signal to produce an intermediate frequency (IF) signal;
providing the IF signal to a transimpedance amplifier (TIA); and
reducing voltage error at the TIA caused by error charge from parasitic capacitance at an output of the RF amplifier circuit by applying the error charge to first and second cancellation capacitors during a first phase of the LO signal; and subtracting the error charge applied to the first and second cancellation capacitors from a differential output of the RF amplifier circuit during a second phase of the LO signal.

8. The method of claim 7,
wherein down-converting the RF signal with the LO signal includes switching polarity of the differential output of the RF amplifier circuit at a frequency of the LO signal;
and
wherein reducing the voltage error includes:
storing the error charge on the first and second cancellation capacitors; and
subtracting the stored error charge from the differential output of the RF amplifier circuit when the polarity of the polarity of the differential output of the RF amplifier circuit is switched.

9. The method of claim 7,
wherein down-converting the RF signal with the LO signal includes switching polarity of a differential output of the RF amplifier circuit at a frequency of the LO signal;
and
wherein reducing the voltage error includes:
providing current to each of a first output and a second output of the differential output of the RF amplifier circuit; and
increasing the current when the polarity of the differential output of the RF amplifier circuit is switched.

10. The method of claim 7,
wherein mixing the RF signal with the LO signal includes switching polarity of the differential output of the RF amplifier circuit at a frequency of the LO signal; and
wherein reducing the voltage error includes filtering the mixed RF signal utilizing a notch filter.

11. An electronic system comprising:
a low noise amplifier (LNA) circuit configured to receive a radio frequency (RF) signal when operatively coupled to an RF antenna, wherein the LNA circuit has a differential output including a first amplifier output and a second amplifier output; and
an RF signal circuit path including:
a local oscillator (LO) circuit to produce a LO signal, wherein the LO signal has multiple phases;
a mixer circuit configured to mix the RF signal with the LO signal to produce a mixed RF signal;
a transimpedance amplifier (TIA) circuit to receive the mixed RF signal;
a pass-filter circuit operatively coupled to the TIA circuit; and
an error reduction circuit, operatively coupled to the TIA circuit, configured to reduce voltage error caused by parasitic charge at an output of the LNA circuit, wherein the error reduction circuit includes:
first and second cancellation capacitors coupled respectively to the first and second amplifier outputs; and
a switching circuit configured to apply the parasitic charge to the first and second cancellation capacitors during a first phase of the LO signal and subtract the parasitic charge applied to the first and second cancellation capacitors from the differential output during a second phase of the LO signal.

12. The electronic system of claim 11,
wherein the mixer circuit includes a first mixer input and a second mixer input, and the TIA circuit has a differential input; and
wherein the error reduction circuit includes a first voltage-controlled current source coupled to the first mixer input and a second voltage-controlled current source coupled to the second mixer, and the voltage error increases current of one or both of the first and second voltage-controlled current sources to reduce the voltage error at the differential input of the TIA circuit.

13. The electronic system of claim 11, wherein the error reduction circuit includes a notch filter circuit having a transfer function that includes at least one null point near one or more harmonic frequencies of the LO signal.

14. The electronic system of claim 11, wherein the RF signal circuit path is an in-phase signal circuit path.

15. The electronic system of claim 11, wherein the RF signal circuit path is a quadrature circuit path.

16. The electronic system of claim 11, wherein the mixer circuit produces an intermediate radio frequency (IF) signal, and the pass filter is a baseband pass filter.

17. The electronic system of claim 11, wherein the mixer circuit produces a low radio frequency (LF) signal, and the pass filter is a low pass filter.

\* \* \* \* \*

UNITED STATES PATENT AND TRADEMARK OFFICE
CERTIFICATE OF CORRECTION

| | | |
|---|---|---|
| PATENT NO. | : 11,658,616 B2 | Page 1 of 1 |
| APPLICATION NO. | : 17/237887 | |
| DATED | : May 23, 2023 | |
| INVENTOR(S) | : Debopam Banerjee | |

It is certified that error appears in the above-identified patent and that said Letters Patent is hereby corrected as shown below:

In the Claims

In Column 9, Line 41, Claim 6, delete "harmonics" and insert --harmonic-- therefor In Column 9, Line 45, Claim 7, delete "circuit" and insert --circuit;-- therefor In Column 10, Lines 2-3, Claim 8, delete "the polarity of the polarity of" and insert --the polarity of-- therefor Signed and Sealed this
Tenth Day of September, 2024

Katherine Kelly Vidal
*Director of the United States Patent and Trademark Office*